United States Patent
Dunn et al.

(10) Patent No.: US 9,578,273 B2
(45) Date of Patent: Feb. 21, 2017

(54) MODULAR SYSTEM FOR CONTROLLING A LIQUID CRYSTAL DISPLAY

(75) Inventors: William Dunn, Alpharetta, GA (US); Jerry Wasinger, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 132 days.

(21) Appl. No.: 13/045,272

(22) Filed: Mar. 10, 2011

(65) Prior Publication Data

US 2012/0062804 A1 Mar. 15, 2012

Related U.S. Application Data

(63) Continuation of application No. 12/684,608, filed on Jan. 8, 2010.

(60) Provisional application No. 61/312,538, filed on Mar. 10, 2010, provisional application No. 61/379,193, filed on Sep. 1, 2010, provisional application No. 61/143,189, filed on Jan. 8, 2009.

(51) Int. Cl.
| | |
|---|---|
| *H05K 1/11* | (2006.01) |
| *H04N 5/64* | (2006.01) |
| *G06F 1/16* | (2006.01) |
| *G06F 1/18* | (2006.01) |
| *H01R 12/50* | (2011.01) |
| *H04N 5/63* | (2006.01) |

(52) U.S. Cl.
CPC .............. *H04N 5/64* (2013.01); *G06F 1/1601* (2013.01); *G06F 1/181* (2013.01); *G06F 2200/1612* (2013.01); *H01R 23/70* (2013.01); *H01R 23/7005* (2013.01); *H04N 5/63* (2013.01); *H05K 2201/1034* (2013.01)

(58) Field of Classification Search
CPC ................ H01R 23/70; H01R 23/7005; H05K 2201/1034
USPC ..... 361/679.41, 679.32, 679.37, 361/679.38, 679.39, 727, 728, 729, 731, 733, 736, 361/737, 741, 756, 784, 785, 788, 792; 345/99
See application file for complete search history.

(56) References Cited

U.S. PATENT DOCUMENTS

| | | | |
|---|---|---|---|
| 5,640,302 A * | 6/1997 | Kikinis | .................... 361/679.41 |
| 6,937,258 B2 | 8/2005 | Lim | |
| 7,064,672 B2 | 6/2006 | Gothard | |
| 7,230,659 B2 | 6/2007 | Ha | |
| 7,518,600 B2 * | 4/2009 | Lee | ................................ 345/204 |

(Continued)

FOREIGN PATENT DOCUMENTS

| | | |
|---|---|---|
| KR | 10-2008-0029114 | 4/2008 |
| KR | 10-2008-0046335 | 5/2008 |

*Primary Examiner* — Binh Tran
(74) *Attorney, Agent, or Firm* — Standley Law Group LLP

(57) ABSTRACT

A removable video module for a backlit liquid crystal display (LCD) contained within a chassis and having a timing and control board (TCON) with a board edge connector and an access opening in the chassis. The module preferably having a video input connection and means for generating a Low Voltage Differential Signaling (LVDS) video. The video module also preferably has a board edge connector adapted to connect with the board edge connector on the TCON, where the video module is adapted to fit through the access opening to connect with the TCON. Other embodiments may utilize a backplane where the video module and a power module are adapted to connect with the backplane and electrically communicate with the rest of the (Continued)

display. Outputs for either the video signal, power supply, or both may be provided so that a plurality of displays may be daisy-chained together.

9 Claims, 2 Drawing Sheets

(56) References Cited

U.S. PATENT DOCUMENTS

2006/0292931 A1* 12/2006 Tokuda .......................... 439/607
2008/0018584 A1* 1/2008 Park et al. ...................... 345/99

* cited by examiner

MODULAR SYSTEM FOR CONTROLLING A LIQUID CRYSTAL DISPLAY

CROSS-REFERENCE TO RELATED APPLICATIONS

This application is a non-provisional application of U.S. Application No. 61/312,538 filed on Mar. 10, 2010 and incorporated by reference as if fully recited herein. This application is also a non-provisional application of U.S. Application No. 61/379,193 filed on Sep. 1, 2010 and incorporated by reference as if fully recited herein. This application is a continuation in part of U.S. application Ser. No. 12/684,608 filed on Jan. 8, 2010 which is a non-provisional of U.S. Application No. 61/143,189 filed on Jan. 8, 2009, both of which are incorporated by reference as if fully recited herein.

TECHNICAL FIELD

Exemplary embodiments generally relate to subassemblies for controlling LCD displays.

BACKGROUND OF THE ART

Electronic displays such as LCDs are being used in a variety of new applications across a number of different platforms. In some applications, base level LCD assemblies may be purchased from a manufacturer and later modified with housings and additional circuitry to perform the user's desired end functions. In most applications, adding new circuitry requires extensive labor and additional connectors and wiring. This labor is not only expensive and time-consuming, but the additional connectors and wiring are prone to failure or malfunction over time. Further, when these components malfunction in the field, removing the display and servicing it can be very expensive and time-consuming.

SUMMARY OF THE EXEMPLARY EMBODIMENTS

Exemplary embodiments utilize a similar base LCD device while permitting a plurality of different video modules to be installed which can provide a number of different features. Power can be shared throughout the various boards so that separate power modules and connections are not required. The video modules may be connected using board edge connectors to the timing and control boards so that they can easily be installed initially and removed/serviced once in the field. The embodiments allow for a base unit to be mass-manufactured while provided a number of specific features to customers that can easily be installed or even upgraded when the customer would like to change their display setups.

An alternative embodiment may provide a power module as well as the video module. Each module may connect with a backplane which can distribute the power and signals throughout the components of the display. Output power as well as output video may be used with some modules so that displays can be 'daisy-chained' together in order to reduce installation costs and time. Some embodiments may include a speaker on one or both of the modules so that sound reproduction may be included as an option.

The foregoing and other features and advantages will be apparent from the following more detailed description of the particular embodiments of the invention, as illustrated in the accompanying drawings.

BRIEF DESCRIPTION OF THE DRAWINGS

A better understanding of an exemplary embodiment will be obtained from a reading of the following detailed description and the accompanying drawings wherein identical reference characters refer to identical parts and in which.

DETAILED DESCRIPTION

Figure 1:
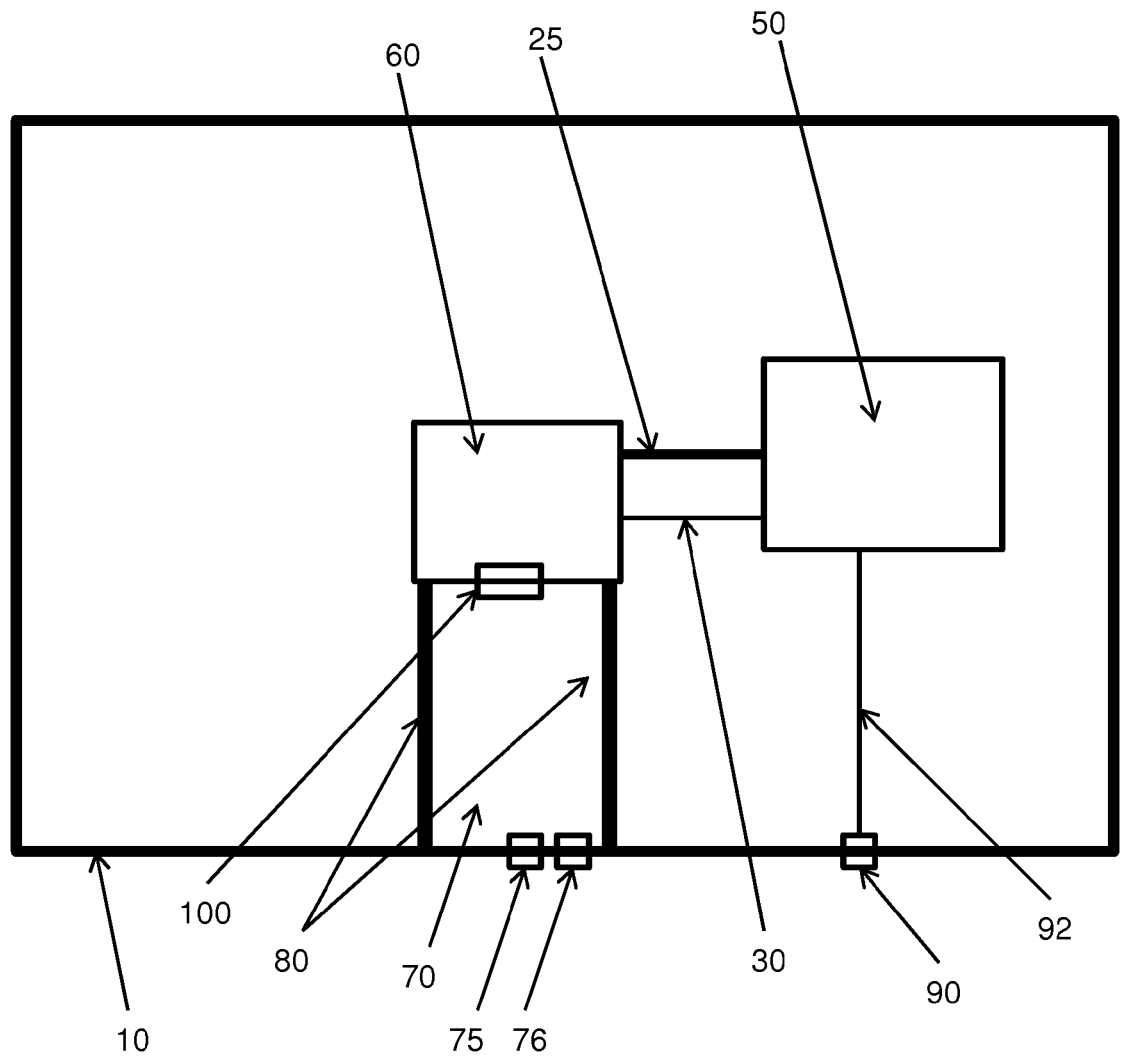
FIG. 1 is a block diagram of an exemplary embodiment using a video player module.

FIG. 1 shows an embodiment of the integrated power supply system, preferably for use with an LED-backlit LCD. For an exemplary embodiment, the LED-backlit LCD along with the LED power and system supply power board (LPB) 50 and the timing and control board (TCON) 60 would be mass-manufactured with similar features. The video module 70 could be designed specifically for each end user and could be easily installed within the mass-manufactured portions of the LCD.

The LPB 50 may provide several power supplies. In some embodiments, the LPB 50 may provide at least two power supplies: a first power supply which takes the inlet AC power from the user's premises and converts this to the low voltage DC required by the electronics (some of this power may be routed to the TCON 60 and video module 70) and a second power supply which drives the LEDs used in the backlight assembly. In other embodiments, there may be an auxiliary power supply (in addition to the first and second) which may send the current required by any other miscellaneous electronics. In some embodiments, the first or second power supply may actually contain more than one physical power brick or supply assembly.

The AC power input 90 may establish communication with the AC power at the location and conduction line 92 may deliver the power to the LPB 50. As taught further below, it may be preferable to also include an AC power outlet such that a second (or third etc.) electronic display can draw power through the first display (so that connecting each display to the local AC power individually is not necessary). Another power conduction line 30 may be used to transfer power from the LPB to the TCON 60. A signal conduction line 25 may be used to transfer various electronic signals back-and-forth between the LPB 50 and the TCON 60.

A video input connection 75 may be provided on the LPB 50 for accepting incoming video data. A video output connection 76 may also be provided on the LPB 50 for allowing a video data output from the display. By using the video output connection 76, several displays may be connected in 'series' or 'daisy-chained' so that overall cabling from the video source can be reduced.

The TCON 60 may convert the differential video signals from the video module 70 into signals required to drive the rows and column circuits of the LCD cell. The TCON 60 may also provide motion compensation and interpolation to convert incoming signals from 60 Hz to 120 Hz, 240 Hz, or greater. The TCON 60 may also analyze the video data in order to dynamically dim the backlight. A board-edge connector 100 may be used to connect the TCON 60 with the video module 70. The connector 100 may allow the TCOM 60 to pass power to and receive video data from the video module 60.

A chassis 10 may be used to house the, sometimes mass-manufactured, display components (LCD, TCON, LPB, etc.) and may contain the mechanical features necessary to hold the video module 70 in place. An access opening may be provided in the chassis and sized to allow the video module 70 to pass through the chassis and attach to the TCON 60. An access panel (preferably lockable) can be provided to cover the access opening so that the video module 70 can easily be accessed, even once the display has been placed in the field. Chassis-mounted guides 80 may allow the video module 70 to accurately and repeatably plug into the TCON 60. The guides 80 may be card guides if using a printed-circuit board or other thin substrate or may be drawer guides if using a different type of substrate.

The video module 70 could be produced in a variety of formats with a number of different components and functions to meet the end-user's needs. Every video module 70 should pass video data to the TCON 60. In addition, every video module 70 should have an edge connector 100 (or some form of blind-mate connector) that will connect the locally generated Low Voltage Differential Signaling (LVDS) video signal to the TCON 60 as well as pick up DC power from the LPB 50 (available through the TCON 60). Additionally, a pair of board extractors may allow the user to overcome any insertion or extraction forces presented by the board edge connector 100.

The video modules 70 may vary by the source of the video content and how 'smart' the onboard processor will be. There are a number of means for generating the LVDS for the TCON. Some video modules 70 may contain DVI/HDMI/DisplayPort inputs with basic processing capabilities. Other video modules 70 may contain wired Ethernet video over IP with a large set of processing features (status and setup information may be accessible via a wired Ethernet connection). Still other video modules 70 may contain wireless Ethernet video over IP with a large set of processing features (status and setup information may be accessible via wired or wireless Ethernet connections). Still other video modules 70 may contain high definition analog video via a coax connection (i.e. cable TV) with basic processing features. Still other video modules 70 may contain an embedded video player where the content to the player can be uploaded with a wired Ethernet connection.

It should be noted that the video module 70 can take on many forms. In some embodiments, the module may be a printed circuit boards with the various components mounted to the board and electrical conduction lines built into one or more layers of the board. Alternatively, the module may simply provide a structure (ex. plate or drawer or substrate) for mounting several components, but this structure may not actually comprise a printed circuit board. Thus, components may be mounted or bolted to the structure and the electrical connections may be provided by wires/harnesses and connectors rather than incorporated into a layer of the board. A similar type of board edge connector (or blind connector) can be used at the back of the plate or drawer to establish communication with the TCON 60.

Figure 2:
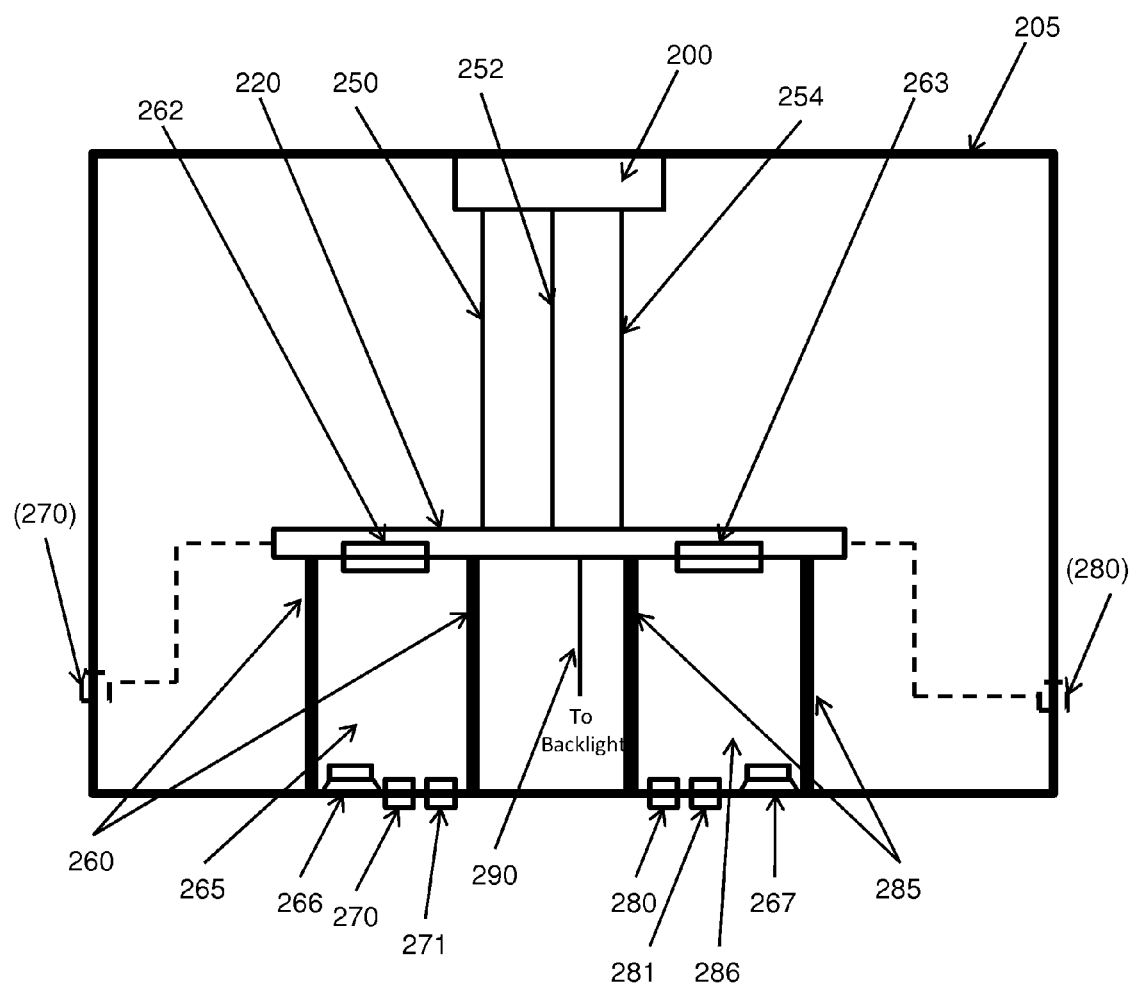
FIG. 2 is a block diagram of another embodiment which uses a video player module as well as a power module.

FIG. 2 shows a block diagram for another embodiment which uses a video module 286 in addition to a power module 265, which connect with a backplane 220 in order to communicate with each other as well as with the TCON 200. The power module 265 may interface with guides 260 so that its connector 262 may line up with that of the backplane 220 when the power module 265 is inserted. Similarly, the video module 286 may interface with guides 285 so that its connector 263 may line up with the backplane 220 when the video module 286 is inserted. The guides 260 and 285 may be fixed to the chassis 205 (or some other portion of the display) which contains the various components and adds structure for securing various assemblies. Access openings may be provided in the chassis 205 and sized to allow the video module 286 or power module 265 to pass through the chassis 205 and attach to the backplane 220.

The power module 265 preferably includes an offline AC power supply which converts AC power from the location to the low voltage DC power typically required by on-board electronics and a DC power supply which provides power to the backlight. Some embodiments may also include an auxiliary power supply which may provide the current for the video module 286 (which is preferably transferred through the backplane 220). An exemplary embodiment contains a power input connection 270 as well as a power output connection 271 on the power module 265. The power output connection 271 allows for multiple displays to be wired in 'series' or 'daisy-chained' so as to reduce the amount of cabling needed. An alternative embodiment would place the power input connection (270) anywhere within the display and simply provide electrical communication with the backplane 220 so that the input power could be routed to the power module 265. The power output connection could also be placed anywhere within the display and simply provide communication with the backplane 220.

The backplane 220 may comprise a printed circuit board with interfacing connectors to the connectors for the power module 265 and video module 286 (as well as the various other electrical communications/connections described herein). The backplane 220 preferably includes conduction lines which allow power from the power module 265 to travel to the TCON 200 (ultimately through power conduction line 250). The backplane 220 may also contain conduction lines which provide power to the video module 286. Preferably, the backplane 220 also provides the power to the backlight through the conduction line 290.

The video module 286 preferably includes a video input connection 280 as well as an optional video output connection 281. Again, the video output connection 281 allows for several displays to be connected in 'series' or 'daisy-chained.' Alternatively, the video input connection (280) could be placed anywhere within the display and simply provide electrical communication with the backplane 220 so that the input video signal could be routed to the video module 286. The video output connection 281 could also be placed anywhere within the display and simply provide electrical communication with the backplane 220.

The connector 263 should preferably provide power from the backplane 220 to the various components of the video module 286. The connector 263 should also allow the video module 286 to output the video signal (preferably Low Voltage Differential Signaling—LVDS) to the backplane 220 and ultimately to the TCON 200 through a video signal conduction line 252. Once the video data is sent through the conduction line 252 to the TCON 200, it may be used to drive the row and column circuits on the LCD. As known in the art, the TCON 200 may also provide various motion compensation and interpolation to convert the incoming signal frequency to the desired frequency for the LCD (i.e. converting 60 Hz to 120 or 240 Hz). In an exemplary embodiment, the TCON 200 would analyze the incoming video data to produce the information necessary to control (i.e. dynamically dim) the backlight. Thus, resulting signals for the backlight may travel through the backlight signal conduction line 254 and connect through the backplane 220 to the power module 265. The signals for the backlight may then be used to direct the DC power supply as to the precise power for the backlight. This precise power information would then preferably be transferred to the backplane 220 where it is sent to the backlight through the conduction line 290.

The video module 286 may also contain an optional speaker 267 and accompanying audio amplifier. Another corresponding speaker 266 may be placed within the power module 265 and receive its signal from the audio amplifier through the power module's 265 connection 262 with the backplane 220. Thus, modules can be designed for end users who desire sound reproduction or prefer no sound production. Later users can also upgrade to sound production even if initially there was none.

Similar to the embodiments described above, the video module 286 may vary widely, depending on the source of the video content and how 'smart' the onboard processor will be. There are a number of means for generating the LVDS for the TCON. Some video modules 286 may contain DVI/HDMI/DisplayPort inputs with basic processing capabilities. Other video modules 286 may contain wired Ethernet video over IP with a large set of processing features (status and setup information may be accessible via a wired Ethernet connection). Still other video modules 286 may contain wireless Ethernet video over IP with a large set of processing features (status and setup information may be accessible via wired or wireless Ethernet connections). Still other video modules 286 may contain high definition analog video via a coax connection (i.e. cable TV) with basic processing features. Still other video modules 286 may contain an embedded video player where the content to the player can be uploaded with a wired Ethernet connection.

It should be noted that the video module 286 and the power module 265 can take on many forms. In some embodiments, the modules may be printed circuit boards with the various components mounted to the board and electrical conduction lines built into one or more layers of the board. Alternatively, the modules may simply provide a structure (ex. plate or drawer) for mounting several components, but this structure may not actually comprise a printed circuit board. Thus, components may be mounted or bolted to the structure and the electrical connections may be provided by wires/harnesses and connectors rather than incorporated into a layer of the board. A similar type of blind connector can be used at the back of the plate or drawer to establish communication with the backplane 220. Using a mounting structure rather than a printed circuit board may allow different types of guides 260 and 285 to be used and may provide a more robust design. Thus, larger or more sensitive components could be mounted directly to the mounting structure and remain secure during install/removal and operation.

An exemplary embodiment may provide a board extractor for the video module 286 or power module 265 or both. An extractor may be used to allow the user to overcome any insertion or extraction force presented by the connectors 262 and 263.

The exemplary embodiments herein permit a unitary design for the LCD/TCON to be mass manufactured while video (and sometimes power) modules can later be designed/installed in a fast and efficient manner depending on the customer's requirements. Once in use, the modules can also be easily replaced/serviced/upgraded while the device remains in the field.

Having shown and described preferred embodiments, those skilled in the art will realize that many variations and modifications may be made to affect the described embodiments and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

The invention claimed is:

1. A modular electrical system for controlling a backlit liquid crystal display (LCD) contained within a chassis, the system comprising:
   a system supply power board;
   an AC power input in electrical communication with the system supply power board;
   a timing and control board (TCON) in electrical communication with the system supply power board through a signal conduction line and a power conduction line;
   a board edge connector on the TCON;
   an access opening in the chassis; and
   a video module comprising a printed circuit board having an edge sized to connect with the board edge connector on the TCON, where the video module is sized to fit through the access opening to connect with the TCON
   wherein the board edge connector allows the TCON to pass the power conduction line and the signal conduction line to the video module and accepts the edge of the printed circuit board of the video module into the board edge connector.

2. The control system of claim 1 further comprising:
   a pair of guides which accept and guide the video module towards the TCON.

3. The control system of claim 1 further comprising:
   a video input connection on the video module.

4. The control system of claim 3 further comprising:
   a video output connection on the video module.

5. The control system of claim 1 wherein:
   the system supply power board comprises:
      a first power supply which powers the TCON and video module, and
      a second power supply which drives the backlight.

6. The control system of claim 1 wherein:
   the board edge connector is a blind connector.

7. The control system of claim 1 wherein:
   the board edge connector is adapted to allow the TCON to pass power to and receive video data from the video module.

8. A removable video module for a backlit liquid crystal display (LCD) contained within a chassis and having a timing and control board (TCON) with a board edge connector passing a signal conduction line and a power conduction line, and an access opening in the chassis, the module comprising:
   a printed circuit board (PCB) having an edge;
   a video input connection mounted on the PCB;
   a means for generating a Low Voltage Differential Signaling (LVDS) video signal from the video input connection mounted on the PCB;
   where the video module is sized to fit through the access opening to connect with the TCON;
   where the edge of the PCB is sized to connect with the board edge connector on the TCON; and
   where the board edge connector allows the TCON to pass the power conduction line and the signal conduction line to the video module and accepts the edge of the printed circuit board of the video module into the board edge connector.

9. The removable video module of claim 8 further comprising:
a video output connection on the video module.

* * * * *